US012622034B2

(12) United States Patent
Toy et al.

(10) Patent No.: US 12,622,034 B2
(45) Date of Patent: May 5, 2026

(54) SEMICONDUCTOR TRANSISTOR STRUCTURE HAVING AN EPITAXIAL OXIDE SPACER LAYER

(71) Applicant: International Business Machines Corporation, Armonk, NY (US)

(72) Inventors: Jennifer Toy, San Leandro, CA (US); Alexander Reznicek, Troy, NY (US); Jingyun Zhang, Albany, NY (US); Sagarika Mukesh, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 18/071,974

(22) Filed: Nov. 30, 2022

(65) Prior Publication Data

US 2024/0178284 A1     May 30, 2024

(51) Int. Cl.
*H10D 64/00* (2025.01)
*H10D 30/01* (2025.01)
(Continued)

(52) U.S. Cl.
CPC ......... *H10D 64/118* (2025.01); *H10D 30/014* (2025.01); *H10D 30/43* (2025.01); *H10D 30/6735* (2025.01); *H10D 62/121* (2025.01); *H10D 64/017* (2025.01); *H10D 84/0167* (2025.01); *H10D 84/017* (2025.01); *H10D 84/0186* (2025.01); *H10D 84/0188* (2025.01); *H10D 84/038* (2025.01); *H10D 84/85* (2025.01)

(58) Field of Classification Search
CPC .... H10D 64/118; H10D 30/014; H10D 30/43; H10D 30/6735; H10D 62/121; H10D 64/017; H10D 84/0167; H10D 84/017; H10D 84/0186; H10D 84/0188; H10D 84/038; H10D 84/85; H10D 30/6757; H10D 30/797; H10D 62/151; H10D 62/116; H10D 84/83; H10D 84/0151
See application file for complete search history.

(56) References Cited

U.S. PATENT DOCUMENTS

| | | |
|---|---|---|
| 6,610,548 B1 | 8/2003 | Ami et al. |
| 6,852,575 B2 | 2/2005 | Bojarczuk, Jr. et al. |

(Continued)

*Primary Examiner* — Yara B Green
(74) *Attorney, Agent, or Firm* — Kristofer Haggerty; Ryan, Mason & Lewis, LLP

(57) ABSTRACT

A semiconductor structure includes a nanosheet channel stack disposed on a semiconductor substrate. The nanosheet channel stack includes one or more layers of a semiconducting material providing nanosheet channels for one or more nanosheet field-effect transistors and an insulator layer as the bottom most layer disposed on the semiconductor substrate. The semiconductor structure further includes an epitaxial oxide spacer layer disposed on outer ends of a bottom surface of the insulator layer and extending downwardly into the substrate; shallow trench isolation regions disposed adjacent the nanosheet channel stack and extending downwardly from a top surface of the semiconductor substrate, wherein a portion of each of the shallow trench isolation regions is disposed on an outer sidewall of the respective epitaxial oxide spacer layer; and a gate surrounding the nanosheet channel stack and on a top surface of each of the shallow trench isolation regions.

20 Claims, 13 Drawing Sheets

(51) Int. Cl.

| | | |
|---|---|---|
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2026.01) |
| *H10D 84/03* | (2025.01) |
| *H10D 84/85* | (2025.01) |

(56) References Cited

U.S. PATENT DOCUMENTS

| | | | |
|---|---|---|---|
| 8,530,327 B2 | 9/2013 | Piper et al. | |
| 10,679,890 B2 | 6/2020 | Reznicek et al. | |
| 10,756,216 B2 | 8/2020 | Miao et al. | |
| 10,847,631 B2 | 11/2020 | Cappellani et al. | |
| 10,916,629 B2 | 2/2021 | Reznicek et al. | |
| 10,930,793 B2 | 2/2021 | Chao et al. | |
| 11,282,961 B2 | 3/2022 | Frougier et al. | |
| 11,302,813 B2 | 4/2022 | Reznicek et al. | |
| 2009/0008705 A1* | 1/2009 | Zhu | H10D 30/791 |
| | | | 257/E21.409 |
| 2016/0163879 A1* | 6/2016 | Adam | H10D 86/01 |
| | | | 257/347 |
| 2018/0219064 A1* | 8/2018 | Cheng | H10D 30/014 |
| 2019/0164840 A1* | 5/2019 | Ching | H10D 64/516 |
| 2019/0237360 A1* | 8/2019 | Reznicek | H10D 30/0323 |
| 2020/0273753 A1 | 8/2020 | Loubet et al. | |

* cited by examiner

100

104

102

SEMICONDUCTOR TRANSISTOR STRUCTURE HAVING AN EPITAXIAL OXIDE SPACER LAYER

BACKGROUND

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor FETs (MOSFETs). Complementary MOS (CMOS) devices are widely used, where both n-type and p-type transistors (nFET and pFET) are used to form logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

SUMMARY

Illustrative embodiments of the present application include techniques for use in semiconductor manufacture. In an illustrative embodiment, a semiconductor structure comprises a nanosheet channel stack disposed on a semiconductor substrate. The nanosheet channel stack comprises one or more layers of a semiconducting material providing nanosheet channels for one or more nanosheet field-effect transistors and an insulator layer as the bottom most layer disposed on the semiconductor substrate. The semiconductor structure further comprises an epitaxial oxide spacer layer disposed on outer ends of a bottom surface of the insulator layer and extending downwardly into the semiconductor substrate. The semiconductor structure further comprises shallow trench isolation regions disposed adjacent the nanosheet channel stack and extending downwardly from a top surface of the semiconductor substrate. A portion of each of the shallow trench isolation regions is disposed on an outer sidewall of the respective epitaxial oxide spacer layer. The semiconductor structure further comprises a gate surrounding the nanosheet channel stack and on a top surface of each of the shallow trench isolation regions.

The semiconductor structure of the illustrative embodiment advantageously provides protection from potential shorts between a replacement metal gate and the semiconductor substrate by utilizing an epitaxial oxide spacer layer.

In one or more additional illustrative embodiments, as may be combined with the preceding paragraphs, the insulator layer is a bottom dielectric insulator layer.

In one or more additional illustrative embodiments, as may be combined with the preceding paragraphs, the semiconductor substrate is silicon and the epitaxial oxide spacer layer comprises a layer of a mixed rare earth oxide, the mixed rare earth oxide being single crystal and lattice-matched to silicon.

In one or more additional illustrative embodiments, as may be combined with the preceding paragraphs, the mixed rare earth oxide comprises a compound having a chemical formula $(A_xB_{1-x})_2O_3$, wherein A represents a first rare earth element and B represents a second rare earth element.

In one or more additional illustrative embodiments, as may be combined with the preceding paragraphs, the mixed rare earth oxide comprises $(La_xY_{1-x})_2O_3$.

In one or more additional illustrative embodiments, as may be combined with the preceding paragraphs, the mixed rare earth oxide comprises a ternary mixed rare earth oxide.

In one or more additional illustrative embodiments, as may be combined with the preceding paragraphs, a lattice constant of the mixed rare earth oxide is twice a lattice constant of the semiconductor substrate.

In one or more additional illustrative embodiments, as may be combined with the preceding paragraphs, a bottom surface of the shallow trench isolation regions is below a bottom surface of the epitaxial oxide spacer layer.

In another exemplary embodiment, a semiconductor structure comprises a first nanosheet channel stack disposed on a semiconductor substrate and a second nanosheet channel stack adjacent the first nanosheet channel stack. The first and second nanosheet channel stacks each comprise one or more layers of a semiconducting material providing nanosheet channels for one or more nanosheet field-effect transistors and an insulator layer as the bottom most layer disposed on the semiconductor substrate. The semiconductor structure further comprises an epitaxial oxide spacer layer disposed on outer ends of a bottom surface of the insulator layer of each of the first and second nanosheet channel stacks and extending downwardly into the semiconductor substrate. The semiconductor structure further comprises shallow trench isolation regions disposed adjacent each of the first and second nanosheet channel stacks and extending downwardly from a top surface of the semiconductor substrate. A portion of each of the shallow trench isolation regions is disposed on an outer sidewall of the respective epitaxial oxide spacer layer. The semiconductor structure further comprises a gate surrounding each of the first and second nanosheet channel stacks and on a top surface of each of the shallow trench isolation regions.

The semiconductor structure of the illustrative embodiment advantageously provides protection from potential shorts between a replacement metal gate and the semiconductor substrate by utilizing an epitaxial oxide spacer layer.

In one or more additional illustrative embodiments, as may be combined with the preceding paragraphs, the insulator layer is a bottom dielectric insulator layer.

In one or more additional illustrative embodiments, as may be combined with the preceding paragraphs, the semiconductor substrate is silicon and the epitaxial oxide spacer layer comprises a layer of a mixed rare earth oxide, the mixed rare earth oxide being single crystal and lattice-matched to silicon.

In one or more additional illustrative embodiments, as may be combined with the preceding paragraphs, the mixed rare earth oxide comprises a compound having a chemical formula $(A_xB_{1-x})_2O_3$, wherein A represents a first rare earth element and B represents a second rare earth element.

In one or more additional illustrative embodiments, as may be combined with the preceding paragraphs, the mixed rare earth oxide comprises $(La_xY_{1-x})_2O_3$ and x is 0.33.

In one or more additional illustrative embodiments, as may be combined with the preceding paragraphs, a lattice constant of the mixed rare earth oxide is twice a lattice constant of the semiconductor substrate.

In one or more additional illustrative embodiments, as may be combined with the preceding paragraphs, a bottom surface of the shallow trench isolation regions is below a bottom surface of the epitaxial oxide spacer layer.

In one or more additional illustrative embodiments, as may be combined with the preceding paragraphs, the semiconductor substrate is disposed between inner sidewalls of the respective epitaxial oxide spacer layer and on the bottom surface of the insulator layer.

Another exemplary embodiment comprises an integrated circuit comprising one or more semiconductor devices. At least one of the one or more semiconductor devices is a semiconductor device according to one or more of the foregoing illustrative embodiments.

The integrated circuit of the illustrative embodiment advantageously allows for semiconductor structures that provide protection from potential shorts between the replacement metal gate and the semiconductor substrate by utilizing an epitaxial oxide spacer layer.

Other embodiments will be described in the following detailed description of embodiments, which is to be read in conjunction with the accompanying figures.

DETAILED DESCRIPTION

Figure 1:
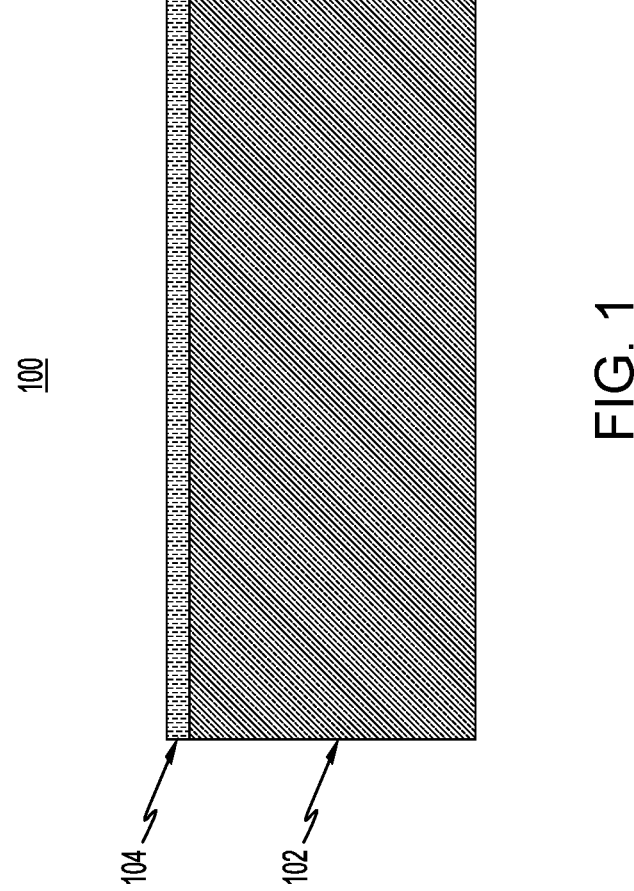
FIG. 1 depicts a side cross-sectional view of a semiconductor structure at a first-intermediate fabrication stage, according to an illustrative embodiment.

Illustrative embodiments of the invention may be described herein in the context of illustrative methods for forming an epitaxial oxide spacer layer in a nanosheet field-effect transistor device, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices. Accordingly, illustrative embodiments described herein may be directed to BEOL semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-topackage connections. In the BEOL, part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Various techniques may be used to form a replacement metal gate in FETs. For example, when forming a replacement metal gate in a FET, the STI region in the substrate is typically etched resulting in the replacement metal gate extending past a bottom dielectric isolation (BDI) layer of the FET. However, this can result in not only potential shorts by the replacement metal gate being in contact with the semiconductor substrate but also can result in extra capacitance, and potentially degrading device performance.

Accordingly, illustrative embodiments described herein overcome the foregoing drawbacks. Referring now to the drawings in which like numerals represent the same of similar elements, FIGS. 1-12B illustrate various processes for fabricating a semiconductor structure. Note that the same reference numeral (100) is used to denote the semiconductor structure through the various intermediate fabrication stages illustrated in FIGS. 1-12B. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 1-12B are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

Referring now to FIGS. 1-12B, FIG. 1 shows a side cross-sectional view of a semiconductor structure 100, following formation of epitaxial oxide spacer layer 104 on substrate 102. The substrate 102 may be formed of any suitable semiconductor structure, including various silicon-containing materials such as silicon (Si), silicon germanium (SiGe) and multi-layers thereof. Although silicon is the predominantly used semiconductor material in wafer fabrication, alternative semiconductor materials can be employed as additional layers, such as, for example, germanium (Ge), gallium arsenide (GaAs), indium gallium arsenide (InGaAs), indium phosphide (InP), cadmium telluride (CdTe), zinc selenide (ZnSe), etc. In one illustrative embodiment, substrate 102 is silicon.

Epitaxial oxide spacer layer 104 is formed on substrate 102. In a non-limiting illustrative embodiment, epitaxial oxide spacer layer 104 may comprise a mixed rare earth material such as a mixed rare earth oxide. In addition, the mixed rare earth oxide is lattice-matched to the semiconductor substrate such as silicon. For example, in one embodiment, epitaxial oxide spacer layer 104 may comprise a mixed rare earth oxide on silicon, with the mixed rare earth oxide being single crystal and lattice-matched to silicon. In one illustrative embodiment, a mixed rare earth oxide is a metastable $(La_xY_{1-x})_2O_3$ alloy, where x is 0.33, a range of from 0.32 to 0.34 is less preferred. This alloy, at x is 0.33, can be lattice-matched to silicon and will crystallize in the cubic structure. That is, in its most basic form, the mixed rare earth oxide is grown on a silicon substrate.

In illustrative embodiments, a lattice constant of the mixed rare earth oxide may be twice a lattice constant of the semiconductor substrate. In illustrative embodiments, a lattice constant of the mixed rare earth oxide may be twice a lattice constant of silicon. In illustrative embodiments, a mixed rare earth material includes oxides which can be used herein in terms of looking at the lattice constants and matching them so that they could match silicon. Suitable mixed rare earth oxides include, for example, samarium (e.g., $(Sm_xY_{1-x})_2O_3$), cerium $(Ce_xY_{1-x})_2O_3$), gadolinium $(La_xGd_{1-x})_2O_3$), gadolinium oxide and europium oxide (e.g., $(Gd_xEu_{1-x})_2O_3$), etc.

In illustrative embodiments, the mixed rare earth oxide comprises a ternary mixed rare earth oxide. In illustrative embodiments, the mixed rare earth oxide comprises a rare earth cubic ternary oxide. In illustrative embodiments, the mixed rare earth oxide will have a majority amount of one rare earth oxide compound, to ensure the resulting ternary mixed rare earth oxide formed on the silicon substrate has a cubic lattice, and will also have a minority amount of another rare earth oxide. A majority amount as used herein should be understood to mean at least about 55% of the ternary mixed rare earth oxide compound. A minority amount as used herein should be understood to mean no more than about 45% of the ternary mixed rare earth oxide compound. Examples of the majority compounds include, but are not limited to, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$, $Y_2O_3$, etc. Examples of the minority compounds include, but are not limited to, $La_2O_3$—, $Ce_2O_3$, $Pr_2O_3$—, $Nd_2O_3$, $Pm_2O_3$—, $Sm_2O_3$, etc.

To be lattice matched with a silicon substrate, the ternary mixed rare earth oxide should have a substantially exact percentage of each compound. By substantially exact percentage of each compound means an exact percentage plus or minus one percent. Representative examples of rare earth oxides matching silicon include La—Y—O with 33% lanthanum, 68.8% gadolinium oxide with 31.2% europium oxide, 91.3% gadolinium oxide with 8.7% lanthanum oxide, 58.5% erbium oxide with 41.2% neodymium oxide, 62.6% erbium oxide with 37.4% lanthanum oxide, etc.

The epitaxial oxide spacer layer 104 can be formed using conventional epitaxial growth techniques such as molecular beam epitaxy (MBE), so that an epitaxial film of good quality may be grown on a substrate 102 such as silicon by depositing the mixed rare earth material such as $(La_xY_{1-x})_2O_3$.

Figure 2:
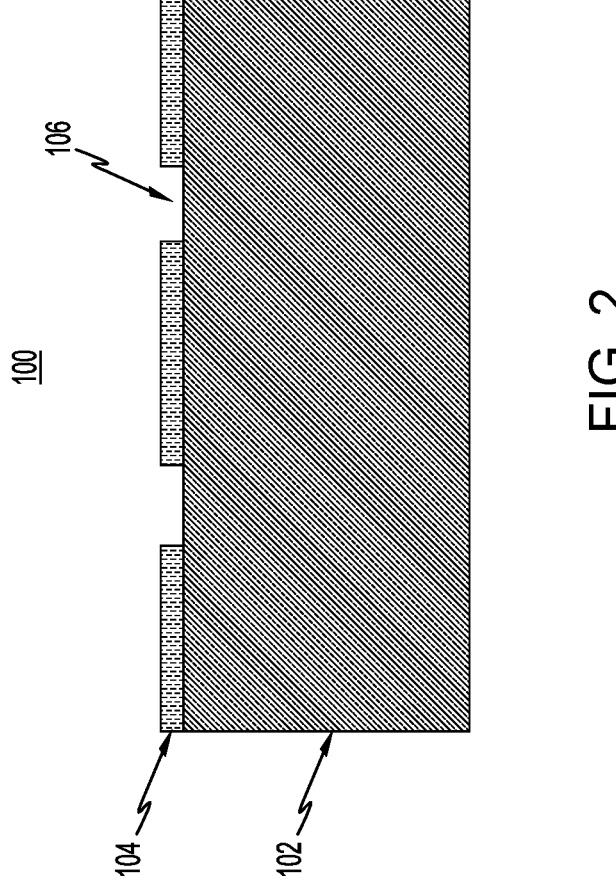
FIG. 2 depicts a side cross-sectional view of the semiconductor structure at a second-intermediate fabrication stage, according to an illustrative embodiment.

FIG. 2 shows semiconductor structure 100 at a second-intermediate fabrication stage. During this stage, epitaxial oxide spacer layer 104 is subjected to standard photolithography and etching processing to form openings 106 and expose substrate 102. For example, in some embodiments, openings 106 are formed by producing a pattern (not shown) on epitaxial oxide spacer layer 104 by applying a photoresist to the surface to be etched; exposing the photoresist to a pattern of radiation; and then developing the pattern into the photoresist utilizing resist developer. Once the patterning of the photoresist is completed, the photoresist is removed. The etching process may be a subtractive etch, e.g., an anisotropic etch, such as reactive ion etch (RIE).

Figure 3:
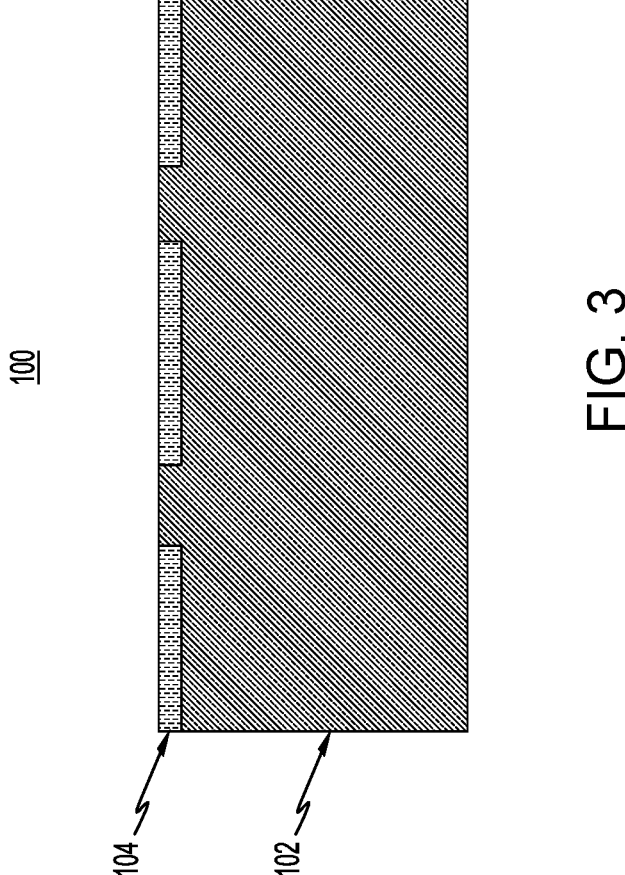
FIG. 3 depicts a side cross-sectional view of the semiconductor structure at a third-intermediate fabrication stage, according to an illustrative embodiment.

FIG. 3 shows semiconductor structure 100 at a third-intermediate fabrication stage. During this stage, the material of substrate 102 such as a silicon is grown in openings 106, utilizing standard growth processing such as epitaxial growth processing. Following the growth of substrate 102 in openings 106, any overgrown material can be removed by a standard planarization process such as chemical mechanical planarization (CMP) or any other suitable planarization process.

Figure 4:
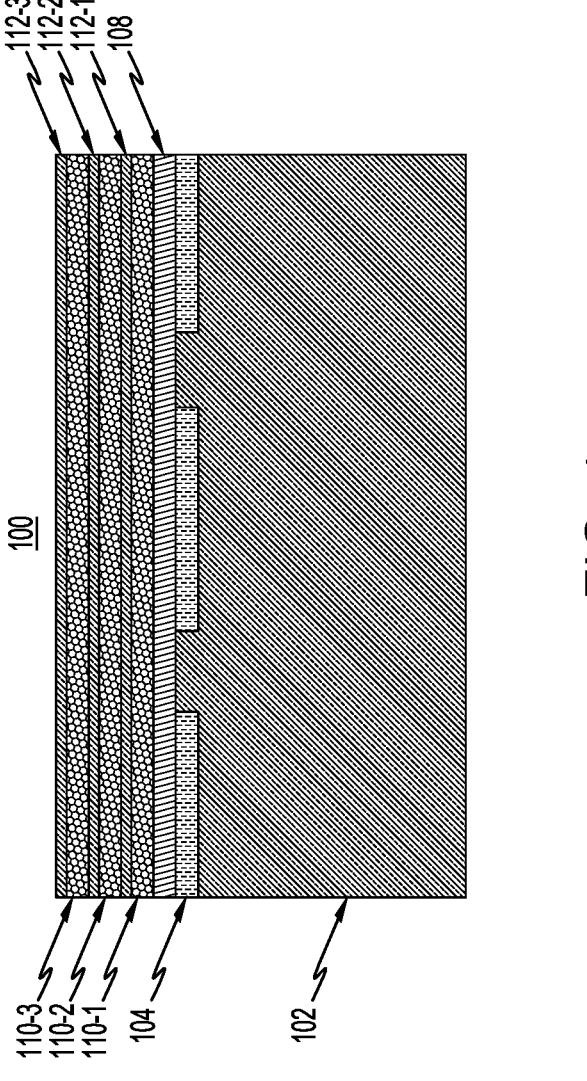
FIG. 4 depicts a side cross-sectional view of the semiconductor structure at a fourth-intermediate fabrication stage, according to an illustrative embodiment.

FIG. 4 shows semiconductor structure 100 at a fourth-intermediate fabrication stage. During this stage, nanosheets are formed over the substrate 102 using standard deposition techniques. In illustrative embodiments, the nanosheets include sacrificial layer 108, sacrificial layers 110-1 through 110-3 (collectively, sacrificial layers 110) and nanosheet channel layers 112-1 through 112-3 (collectively, nanosheet channel layers 112).

The sacrificial layer 108 and sacrificial layers 110 are illustratively formed of different sacrificial materials, such that they may be etched or otherwise removed selective to one another. In some embodiments, both the sacrificial layer 108 and sacrificial layers 110 are formed of an SiGe alloy, but with different percentages of germanium. For example, the sacrificial layers 108 may have a relatively higher percentage of germanium (e.g., 55% Ge), and the sacrificial layers 110 may have a relatively lower percentage of Germanium (e.g., 25% Ge). Other combinations of different sacrificial materials may be used in other embodiments.

The nanosheet channel layers 112 may be formed of silicon or another suitable material (e.g., a material similar to that used for the substrate 102). One skilled in the art will readily appreciate that the material for sacrificial layer 108 will vary depending on the material used for the substrate 102 and the nanosheet channel layers 112.

Figure 5:
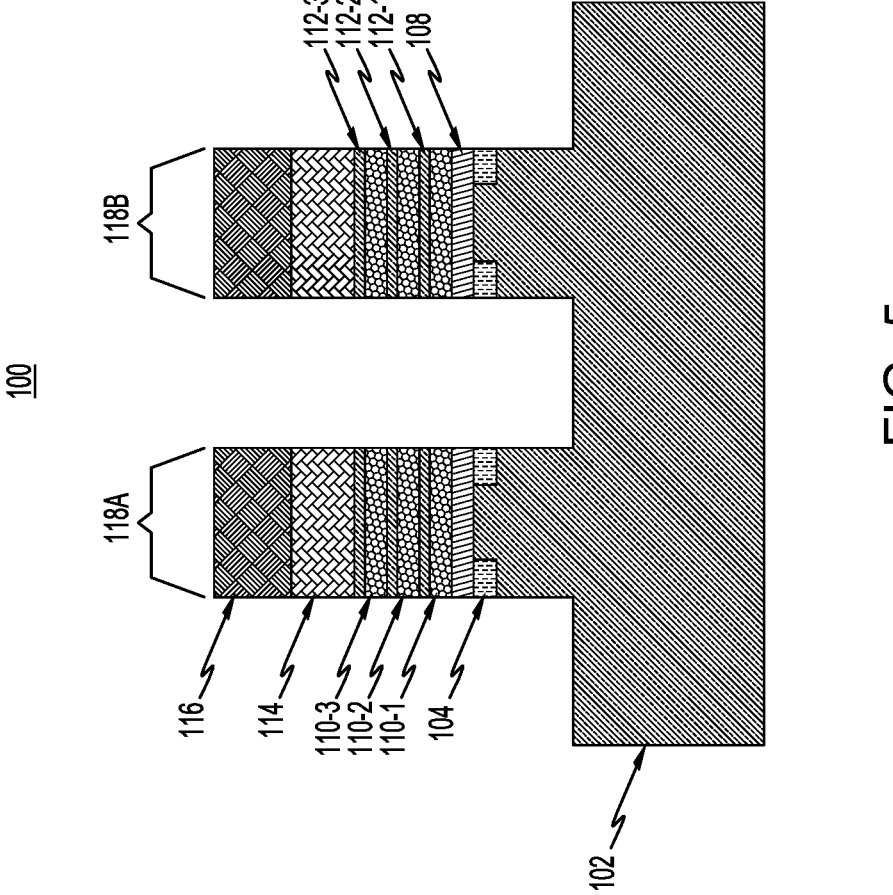
FIG. 5 depicts a side cross-sectional view of the semiconductor structure at a fifth-intermediate fabrication stage, according to an illustrative embodiment.

FIG. 5 shows semiconductor structure 100 at a fifth-intermediate fabrication stage, following the nanosheet patterning and the formation of the FET stacks. Each of FET stacks 118A and 118B contain a FET device. However, this is merely illustrative and it is contemplated that FET stacks 118A and 118B can contain any number of FET devices. The first ones of the FET stacks 118A and 118B may comprise an nFET device and the second ones of FET stacks 118A and 118B may comprise a pFET device.

The FET stacks 118A and 118B are formed by standard photolithography and etching processing. For example, a hardmask layer such as a first hardmask layer 114 and a second hardmask layer 116 can be formed on the topmost nanosheet channel layer 112-3 by standard deposition techniques such as physical vapor deposition (PVD), atomic layer deposition (ALD), chemical vapor deposition (CVD), etc. The material of first hardmask layer 114 includes, for example, a nitride such as SiN or another suitable material. The material of second hardmask layer 116 includes, for example, an oxide such as $SiO_2$, or another suitable material. Next, a suitable etching process such as RIE is carried out to etch exposed portions of the nanosheet channel layers 112, the sacrificial layers 110 and 108, and through a portion of the substrate 102.

Figure 6A:
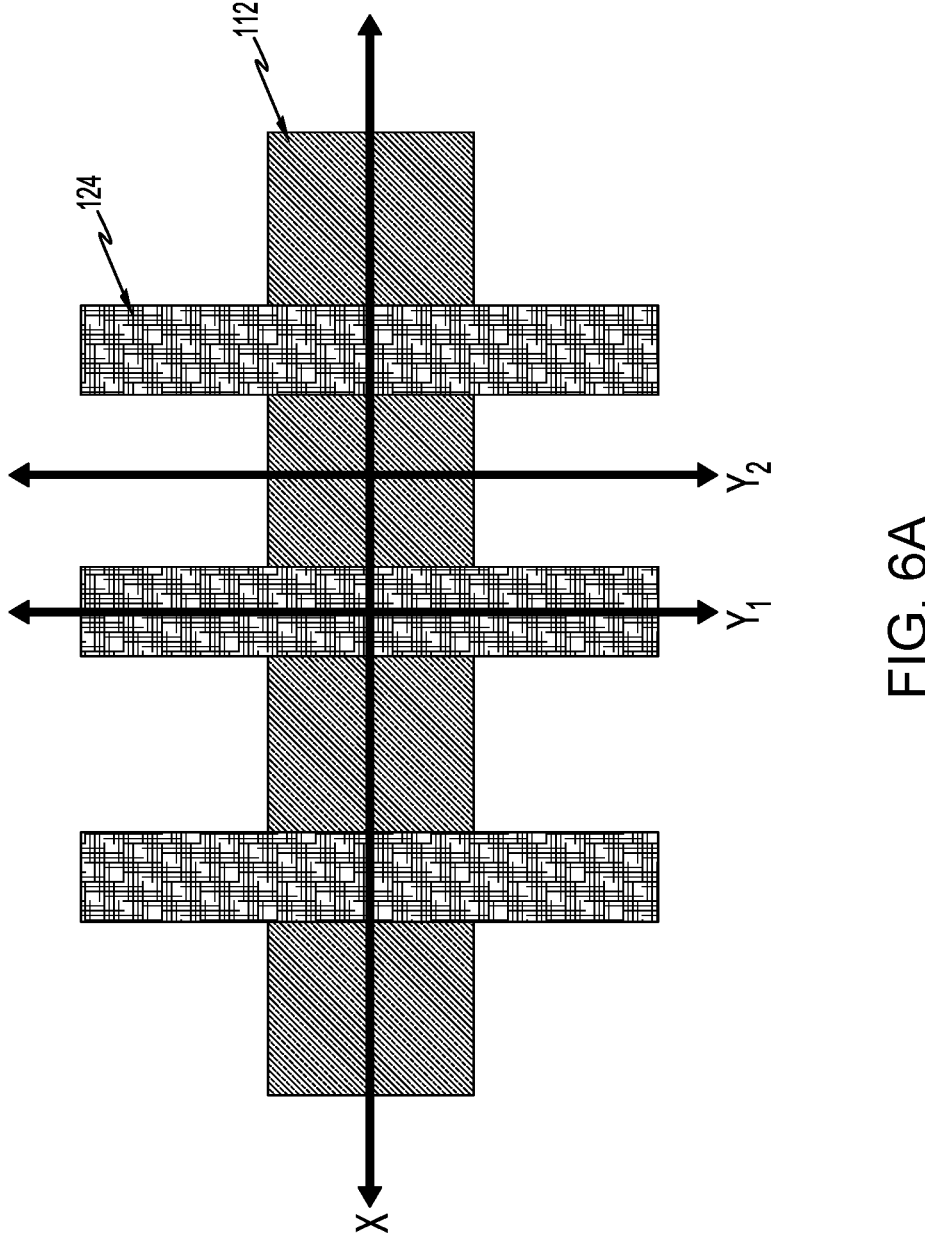
FIG. 6A is a top view of a semiconductor structure for use at a sixth-intermediate fabrication stage, according to an illustrative embodiment.
Figures 6B, 6C:
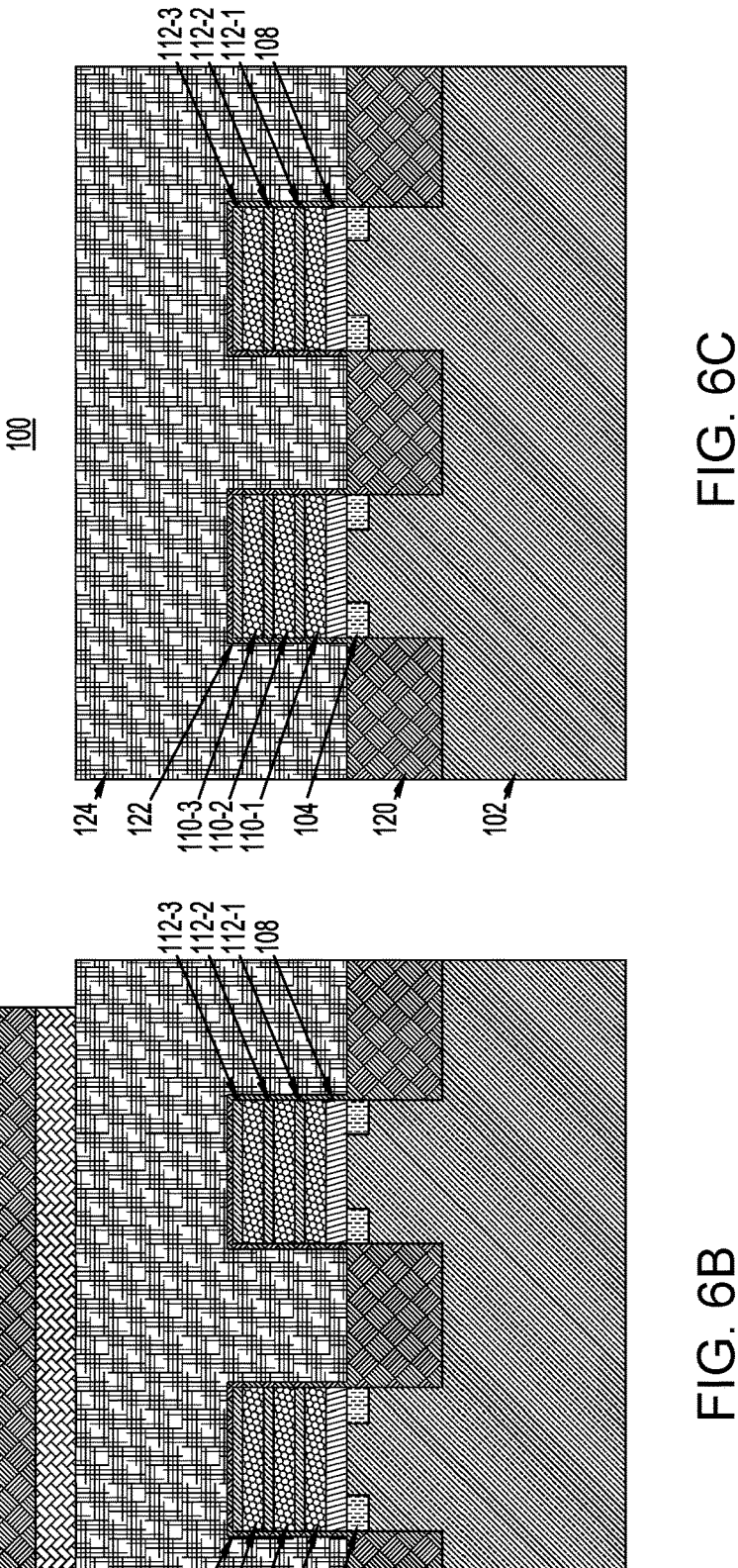
FIG. 6B depicts a side cross-sectional view of the semiconductor structure taken along the Y1-Y1 axis of FIG. 6A for use at the sixth-intermediate fabrication stage, according to an illustrative embodiment.
FIG. 6C depicts a side cross-sectional view of the semiconductor structure taken along the Y2-Y2 axis of FIG. 6A for use at the sixth-intermediate fabrication stage, according to an illustrative embodiment.

FIGS. 6A-6C show semiconductor structure 100 at a sixth-intermediate fabrication stage. The top-down view of FIG. 6A shows nanosheet channel layers 112 where dummy gate 124 will be formed. The first side cross-sectional view of FIG. 6B is taken along the line Y1-Y1 in the top-down view of FIG. 6A, and the second side cross-sectional view of FIG. 6C is taken along the line Y2-Y2 in the top-down view of FIG. 6A.

During this stage, first hardmask layer 114 and second hardmask layer 116 can be removed by any suitable wet or dry etch, followed by formation of the shallow trench isolation (STI) regions 120 on substrate 102. The STI regions 120 may comprise a dielectric material such as silicon dioxide ($SiO_2$), silicon oxycarbide (SiOC), silicon oxynitride (SiON), etc. The STI regions 120 can be formed by any suitable deposition technique such as ALD, PVD and CVD.

Next, an oxide layer 122 is deposited on the nanosheet stacks using any conventional deposition technique such as, for example, PVD or CVD. Oxide layer 122 can be formed of any suitable oxide material such as silicon oxide.

The dummy gate 124 may be formed by blanket deposition of a dummy gate material (e.g., amorphous silicon (a-Si), poly-silicon, an amorphous silicon germanium (a-SiGe) over a thin $SiO_2$ or titanium nitride (TiN) layer, or another suitable material).

Optionally, hardmask layers 126 and 128 can be formed on a portion of the top surface of dummy gate 124 for performing an optional gate cut as discussed below. Hardmask layers 126 and 128 can be formed in a similar manner and of a similar material as first hardmask layer 114 and second hardmask layer 116.

Figure 7B:
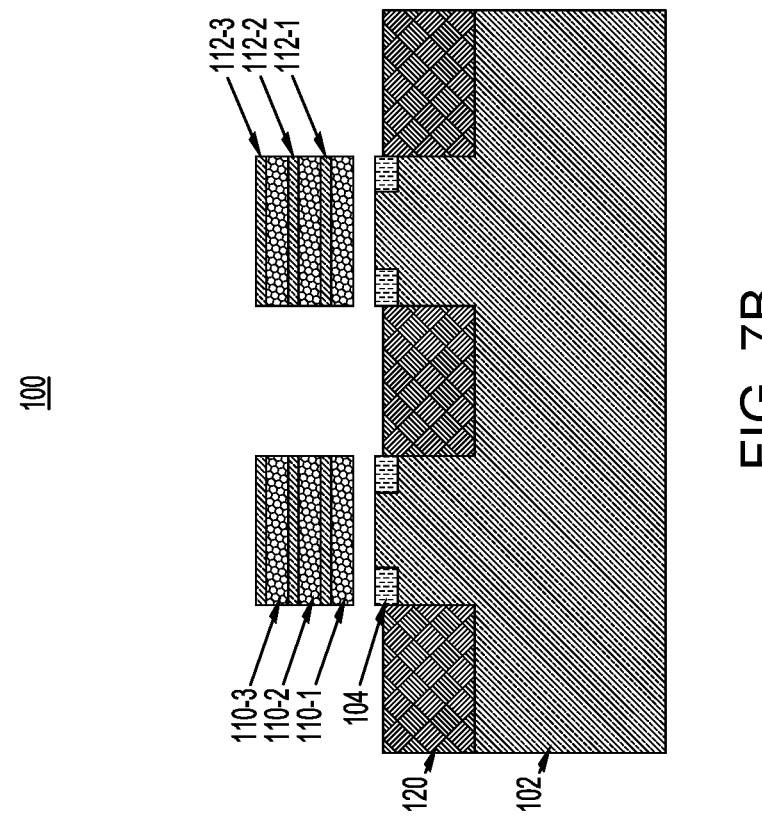
FIG. 7B depicts a side cross-sectional view of the semiconductor structure taken along the Y2-Y2 axis of FIG. 6A for use at the seventh-intermediate fabrication stage, according to an illustrative embodiment.
Figure 7A:
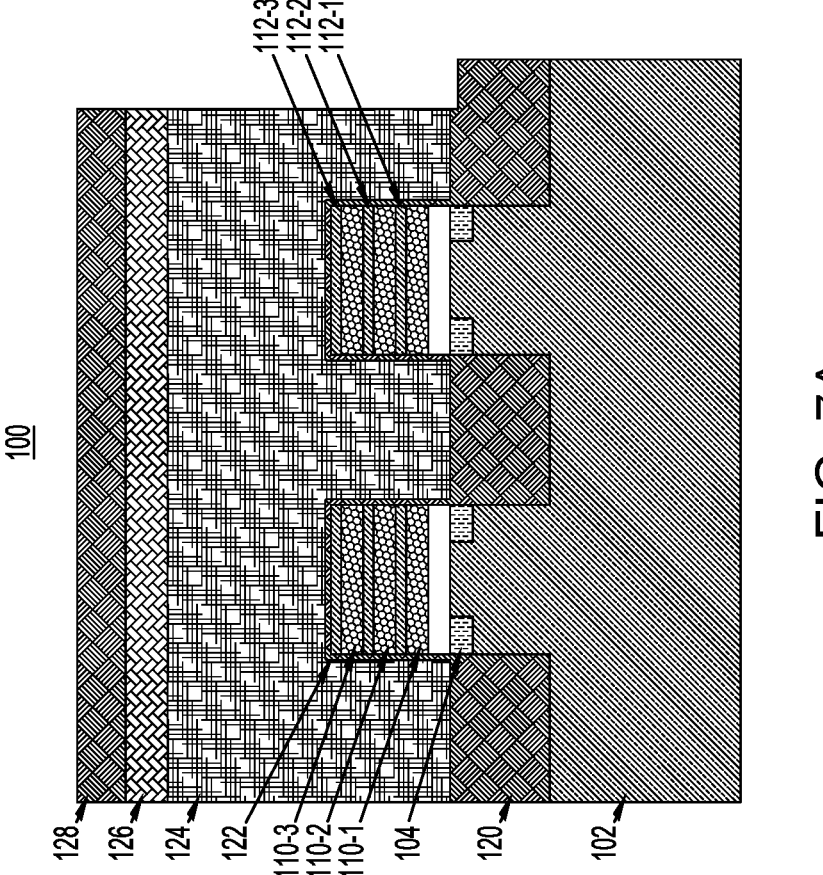
FIG. 7A depicts a side cross-sectional view of the semiconductor structure taken along the Y1-Y1 axis of FIG. 6A for use at a seventh-intermediate fabrication stage, according to an illustrative embodiment.

FIGS. 7A and 7B show semiconductor structure 100 at a seventh-intermediate fabrication stage. During this stage, a gate cut is performed in semiconductor structure 100 by conventional etching techniques such as RIE to selectively remove a portion of dummy gate 124 which stops on the STI regions 120. Next, sacrificial layer 108 is selectively removed using any suitable wet or dry etch. FIG. 7B shows removal of oxide layer 122 using any selective wet or dry etching process.

Figure 8B:
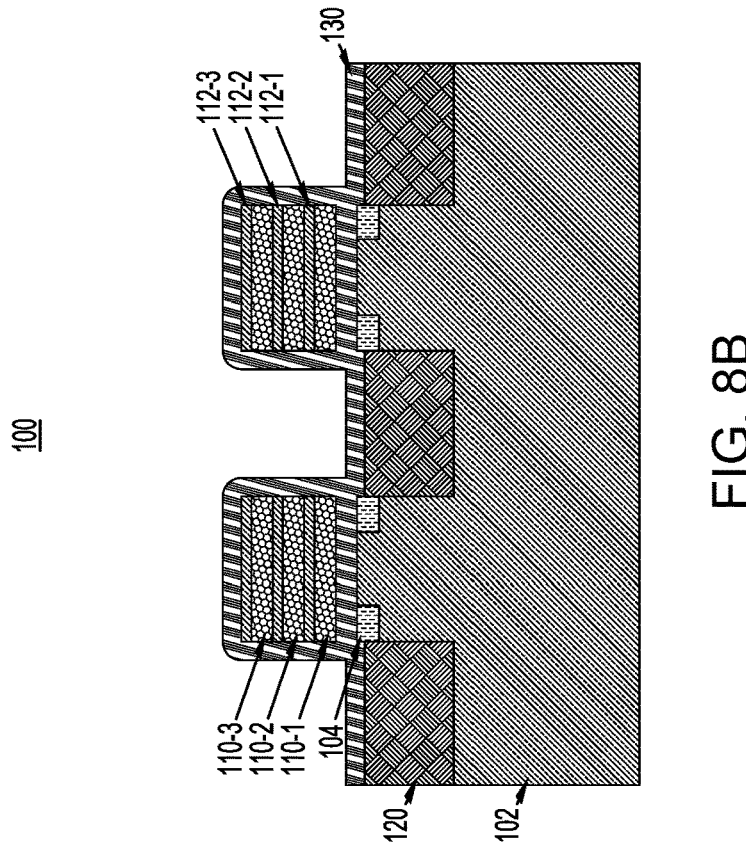
FIG. 8B depicts a side cross-sectional view of the semiconductor structure taken along the Y2-Y2 axis of FIG. 6A for use at the eighth-intermediate fabrication stage, according to an illustrative embodiment.
Figure 8A:
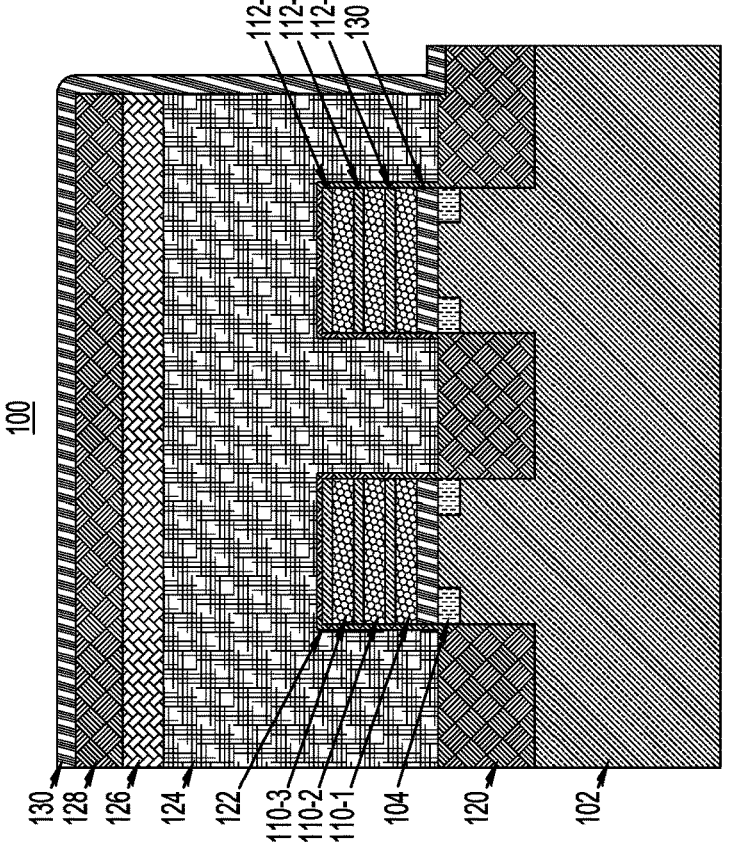
FIG. 8A depicts a side cross-sectional view of the semiconductor structure taken along the Y1-Y1 axis of FIG. 6A for use at an eighth-intermediate fabrication stage, according to an illustrative embodiment.

FIGS. 8A and 8B show semiconductor structure 100 at an eighth-intermediate fabrication stage. During this stage, a bottom dielectric insulator (BDI) layer 130 may be formed in the region previously occupied by sacrificial layer 108 as well as on STI regions 120 and over semiconductor structure 100. BDI layer 130 can be formed of any suitable insulator, such as SiN, silicon boron carbide nitride (SiBCN), silicon oxycarbonitride (SiOCN), etc. The BDI layer 130 may have a similar or larger size as the sacrificial layers 110.

Figures 9A, 9B:
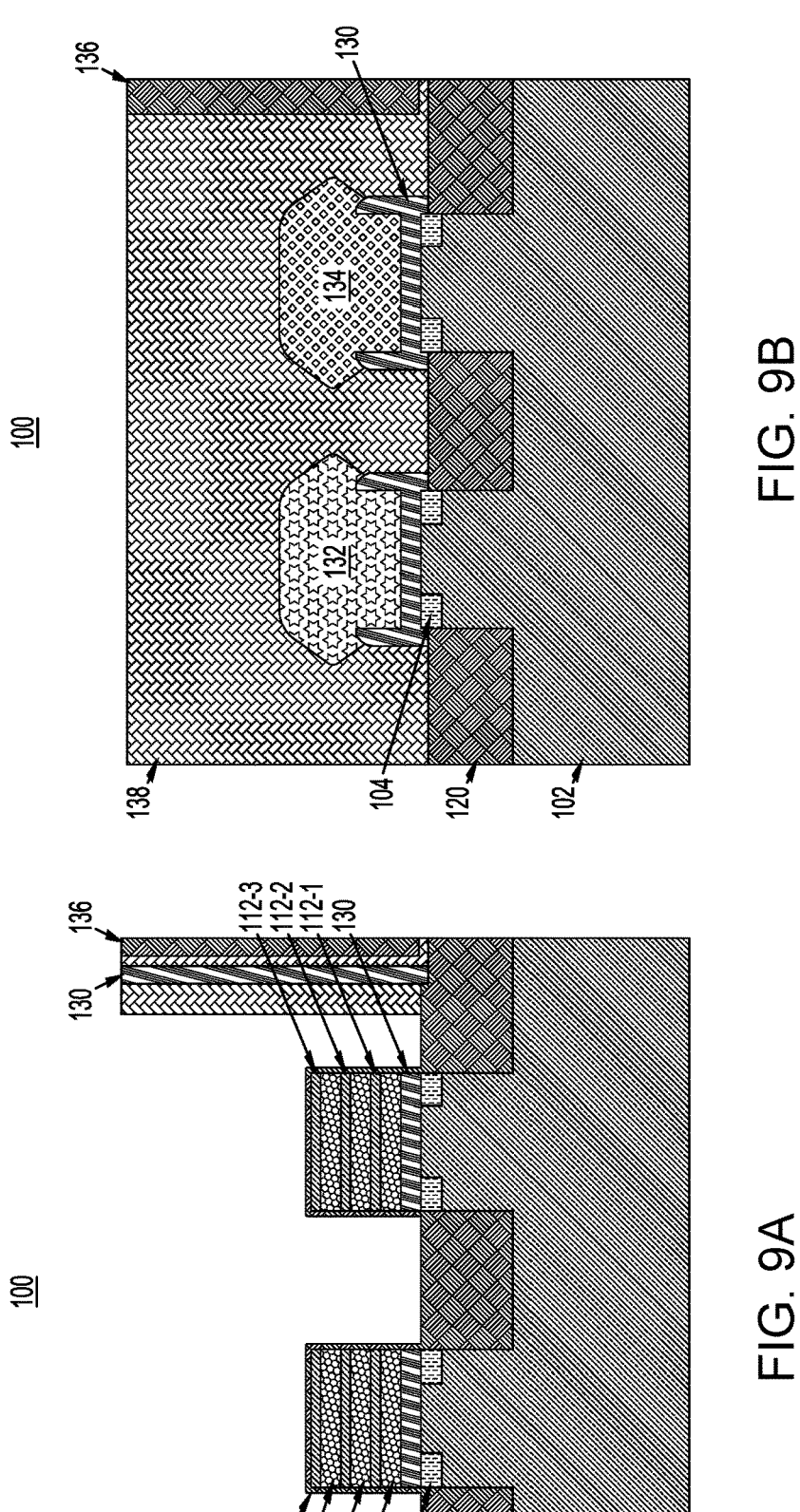
FIG. 9A depicts a side cross-sectional view of the semiconductor structure taken along the Y1-Y1 axis of FIG. 6A for use at a ninth-intermediate fabrication stage, according to an illustrative embodiment.
FIG. 9B depicts a side cross-sectional view of the semiconductor structure taken along the Y2-Y2 axis of FIG. 6A for use at the ninth-intermediate fabrication stage, according to an illustrative embodiment.

FIGS. 9A and 9B show semiconductor structure 100 at a ninth-intermediate fabrication stage. During this stage, the horizontal surface of BDI layer 130 is selectively removed along with dummy gate 124 using any suitable wet or dry etching process. Source/drain regions 132 and 134 are then formed using, for example, epitaxial growth processes. In some embodiments, the epitaxy process comprises in-situ doping (dopants are incorporated in epitaxy material during epitaxy). N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). Epitaxial materials may be grown from gaseous or liquid precursors.

Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain regions can range from $1\times10^{19}$ cm$^{-3}$ to $3\times10^{21}$ cm$^{-3}$, or preferably between $2\times10^{20}$ cm$^{-3}$ to $3\times10^{21}$ cm$^{-3}$.

In illustrative embodiments, source/drain region 132 is a PFET region and source/drain region 134 is an NFET region.

A dielectric fill is deposited in the opening formed from the gate cut and fills the opening to form dielectric pillars 136. The dielectric pillars 136 may be formed by filling a dielectric material such as, for example, SiN, $SiO_2$, SiOC, SiOCN, SiBCN, SiC, etc. in the opening, followed by planarization using CMP or other suitable planarization process.

Next, interlayer dielectric (ILD) layer 138 is formed on source/drain regions 132 and 134 using any conventional deposition process such as ALD, PVD, or CVD, followed by a planarization process such as CMP. ILD layer 138 can be formed of any suitable dielectric material, such as $SiO_2$, SiOC, SiON, etc.

Figures 10A, 10B:
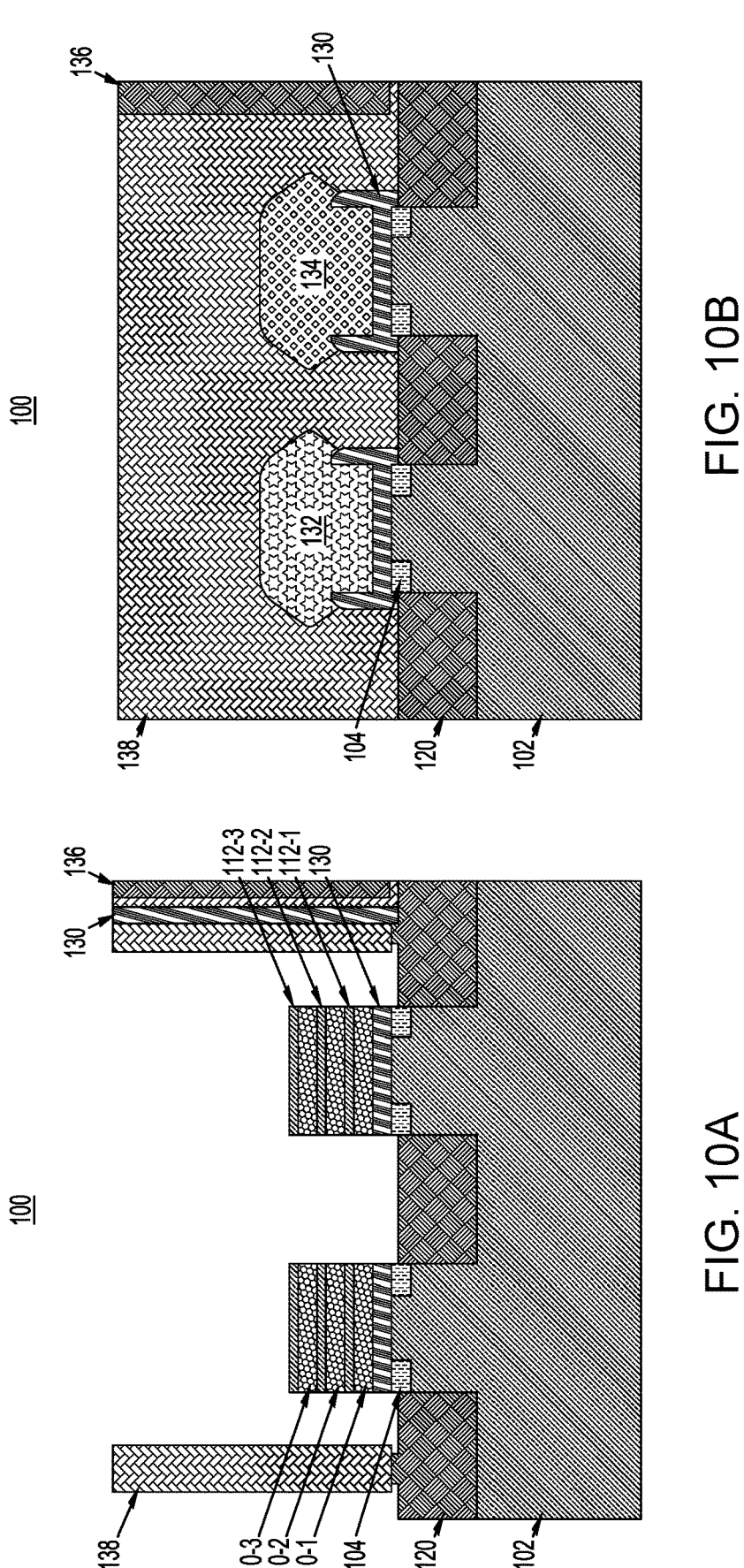
FIG. 10A depicts a side cross-sectional view of the semiconductor structure taken along the Y1-Y1 axis of FIG. 6A for use at a tenth-intermediate fabrication stage, according to an illustrative embodiment.
FIG. 10B depicts a side cross-sectional view of the semiconductor structure taken along the Y2-Y2 axis of FIG. 6A for use at the tenth-intermediate fabrication stage, according to an illustrative embodiment.

FIGS. 10A and 10B show semiconductor structure 100 at a tenth-intermediate fabrication stage. During this stage, oxide layer 122 is selectively removed using a suitable wet or dry etch.

Figures 11A, 11B:
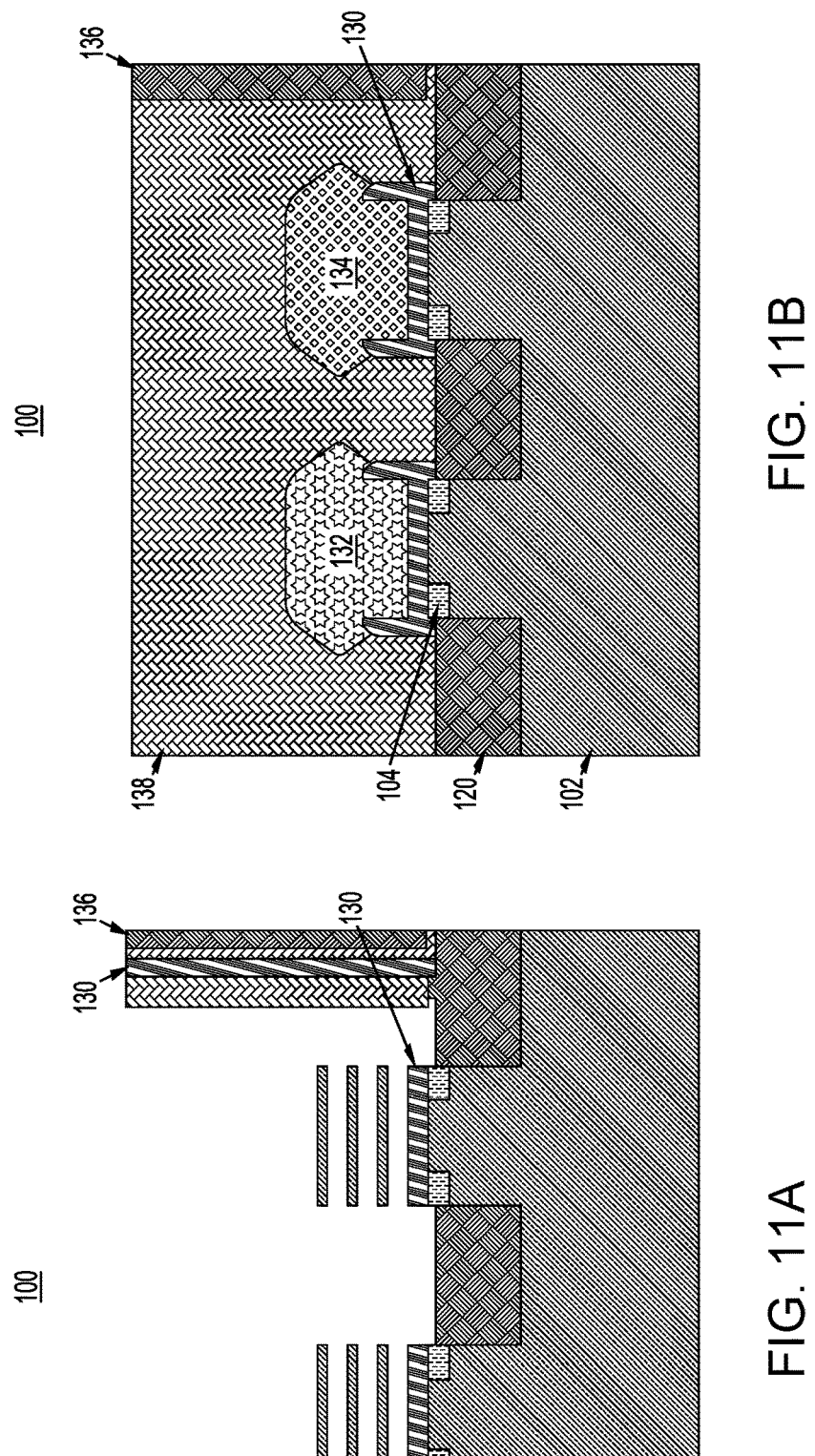
FIG. 11A depicts a side cross-sectional view of the semiconductor structure taken along the Y1-Y1 axis of FIG. 6A for use at an eleventh-intermediate fabrication stage, according to an illustrative embodiment.
FIG. 11B depicts a side cross-sectional view of the semiconductor structure taken along the Y2-Y2 axis of FIG. 6A for use at the eleventh-intermediate fabrication stage, according to an illustrative embodiment.

FIGS. 11A and 11B show semiconductor structure 100 at an eleventh-intermediate fabrication stage. During this stage, sacrificial layers 110 are selectively removed using a suitable wet or dry etch.

Figure 12B:
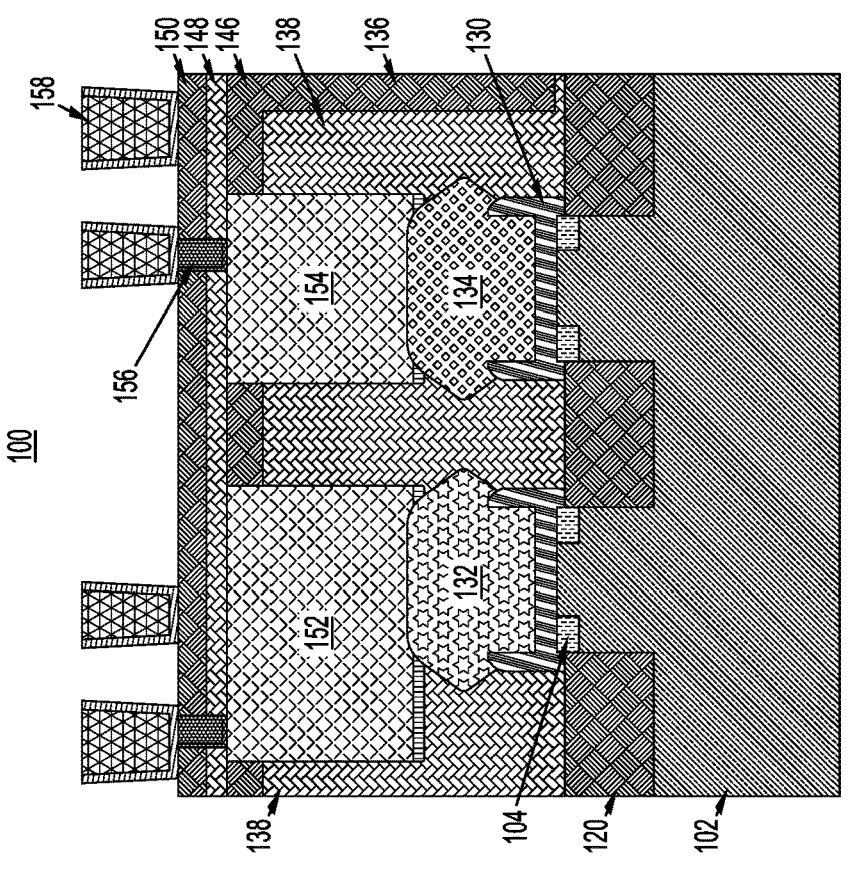
FIG. 12B depicts a side cross-sectional view of the semiconductor structure taken along the Y2-Y2 axis of FIG. 6A for use at the twelfth-intermediate fabrication stage, according to an illustrative embodiment.
Figure 12A:
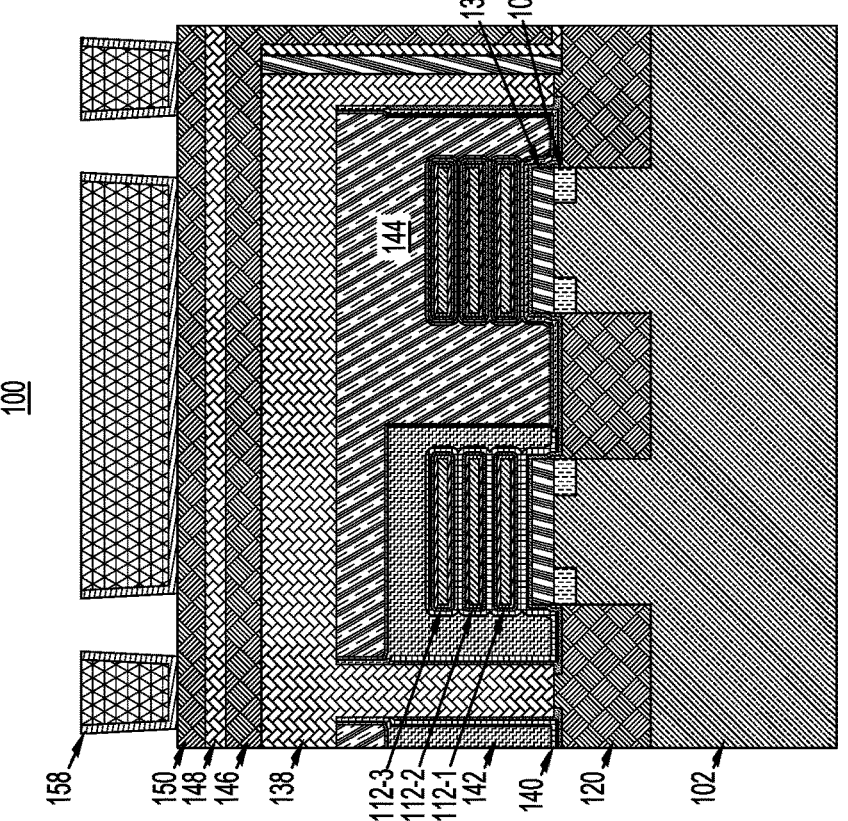
FIG. 12A depicts a side cross-sectional view of the semiconductor structure taken along the Y1-Y1 axis of FIG. 6A for use at a twelfth-intermediate fabrication stage, according to an illustrative embodiment.

FIGS. 12A and 12B show semiconductor structure 100 at a twelfth-intermediate fabrication stage. During this stage, a gate stack layer is formed using, for example, replacement metal gate processing such as a high-k metal gate (HKMG) processing. In illustrative embodiments, the gate stack layer may comprise a gate dielectric layer 140 and a gate conductor layer 142. The gate dielectric layer 140 may be formed of a high-k dielectric material. Examples of high-k dielectric materials include, but are not limited to, metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg).

The gate conductor layer 142 may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

Semiconductor structure 100 further shows a gate contact 144 formed on the gate stack layer including gate dielectric layer 140 and gate conductor layer 142. Suitable metals for gate contact 144 include any conductive material such as, for example, tungsten (W), aluminum (Al), cobalt (Co), nickel (Ni), titanium (Ti), ruthenium (Ru), molybdenum (Mo), or any other suitable conductive material. In various embodiments, the gate contact 144 can be formed utilizing any conventional deposition technique such as CVD, PVD, ALD and/or plating.

Semiconductor structure 100 further shows an additional amount of ILD layer 138 deposited on the gate stack layer and STI regions 120, followed by a planarization process such as CMP. Next, FEOL layers 146, 148 and 150 are formed on ILD layer 138. FEOL layers 146, 148 and 150 can be various ILD layers such as a silicon oxide, silicon nitride and silicon oxide layers using conventional deposition techniques such as ALD.

Semiconductor structure 100 further shows source/drain contacts 152 and 154 formed over source/drain regions 132 and 134, respectively, by standard patterning and lithographic processing. For example, in illustrative embodiments, an additional amount of ILD layer 138 can be deposited on semiconductor structure 100, followed by a planarization process such as CMP. Next, ILD layer 138 is subjected to a conventional lithographic and etching process to form source/drain contact openings. The source/drain contact openings are formed to expose the source/drain regions 132 and 134. A contact metal is then deposited in the resulting source/drain contact openings to form source/drain contacts 152 and 154 using any conventional technique such as ALD, CVD, PVD, and/or plating. Suitable contact metals include, a silicide liner such as Ti, Ni, or NiPt, etc., a thin adhesion metal liner, such as TiN, and high conductive metal fills, such as, for example, tungsten (W), aluminum (Al), cobalt (Co), ruthenium (Ru), molybdenum (Mo), or any other suitable conductive material. The contact metals can be planarized using, for example, a planarizing process such as CMP. Other planarization processes can include grinding and polishing.

Semiconductor structure 100 further shows metal vias 156 and metal containing lines 158. A suitable contact metal for metal vias 156 and metal containing lines 158 can be any of the metals discussed above. The metal vias 156 and metal containing lines 158 can be, for example, power (Vdd) rails to provide supply voltage to the structure and ground (GND or Vss) rails to provide a series of power supplies.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
 a nanosheet channel stack disposed on a semiconductor substrate, the nanosheet channel stack comprising one or more layers of a semiconducting material providing nanosheet channels for one or more nanosheet field-effect transistors and an insulator layer as the bottom most layer disposed on the semiconductor substrate;
 a first epitaxial oxide spacer layer and a second epitaxial oxide spacer layer disposed on respective outer ends of a bottom surface of the insulator layer and extending downwardly into the semiconductor substrate, wherein the semiconductor substrate is disposed between the first epitaxial oxide spacer layer and the second epitaxial oxide spacer layer;
 shallow trench isolation regions disposed adjacent the nanosheet channel stack and extending downwardly from a top surface of the semiconductor substrate, wherein a portion of each of the shallow trench isolation regions is disposed on an outer sidewall of the respective epitaxial oxide spacer layer; and
 a gate surrounding the nanosheet channel stack and on a top surface of each of the shallow trench isolation regions.

2. The semiconductor structure according to claim 1, wherein the insulator layer is a bottom dielectric insulator layer.

3. The semiconductor structure according to claim 1, wherein the semiconductor substrate is silicon and the epitaxial oxide spacer layer comprises a layer of a mixed rare earth oxide, the mixed rare earth oxide being single crystal and lattice-matched to silicon.

4. The semiconductor structure according to claim 3, wherein the mixed rare earth oxide comprises a compound having a chemical formula $(A_xB_{1-x})_2O_3$, wherein A represents a first rare earth element and B represents a second rare earth element.

5. The semiconductor structure according to claim 3, wherein the mixed rare earth oxide comprises $(La_xY_{1-x})_2O_3$ and x is 0.33.

6. The semiconductor structure according to claim 3, wherein the mixed rare earth oxide comprises a ternary mixed rare earth oxide.

7. The semiconductor structure according to claim 3, wherein a lattice constant of the mixed rare earth oxide is twice a lattice constant of the semiconductor substrate.

8. The semiconductor structure according to claim 1, wherein a bottom surface of the shallow trench isolation regions is below a bottom surface of the epitaxial oxide spacer layer.

9. The semiconductor structure according to claim 1, wherein the semiconductor substrate is disposed between inner sidewalls of the respective epitaxial oxide spacer layer and on the bottom surface of the insulator layer.

10. A semiconductor structure, comprising:

a first nanosheet channel stack disposed on a semiconductor substrate and a second nanosheet channel stack adjacent the first nanosheet channel stack, the first and second nanosheet channel stacks each comprising one or more layers of a semiconducting material providing nanosheet channels for one or more nanosheet field-effect transistors and an insulator layer as the bottom most layer disposed on the semiconductor substrate;

a first epitaxial oxide spacer layer and a second epitaxial oxide spacer layer disposed on respective outer ends of a bottom surface of the insulator layer of each of the first and second nanosheet channel stacks and extending downwardly into the semiconductor substrate, wherein the semiconductor substrate is disposed between the first epitaxial oxide spacer layer and the second epitaxial oxide spacer layer;

shallow trench isolation regions disposed adjacent each of the first and second nanosheet channel stacks and extending downwardly from a top surface of the semiconductor substrate, wherein a portion of each of the shallow trench isolation regions is disposed on an outer sidewall of the respective epitaxial oxide spacer layer; and a gate surrounding each of the first and second nanosheet channel stacks and on a top surface of each of the shallow trench isolation regions.

11. The semiconductor structure according to claim 10, wherein the insulator layer is a bottom dielectric insulator layer.

12. The semiconductor structure according to claim 10, wherein the semiconductor substrate is silicon and the epitaxial oxide spacer layer comprises a layer of a mixed rare earth oxide, the mixed rare earth oxide being single crystal and lattice-matched to silicon.

13. The semiconductor structure according to claim 12, wherein a lattice constant of the mixed rare earth oxide is twice a lattice constant of the semiconductor substrate.

14. The semiconductor structure according to claim 12, wherein the mixed rare earth oxide comprises a compound having a chemical formula $(A_xB_{1-x})_2O_3$, wherein A represents a first rare earth element and B represents a second rare earth element.

15. The semiconductor structure according to claim 12, wherein the mixed rare earth oxide comprises $(La_xY_{1-x})_2O_3$ and x is 0.33.

16. The semiconductor structure according to claim 10, wherein a bottom surface of the shallow trench isolation regions is below a bottom surface of the epitaxial oxide spacer layer.

17. The semiconductor structure according to claim 10, wherein the semiconductor substrate is disposed between inner sidewalls of the respective epitaxial oxide spacer layer and on the bottom surface of the insulator layer.

18. An integrated circuit, comprising:

one or more semiconductor structures, wherein at least one of the one or more semiconductor structures comprises:

a nanosheet channel stack disposed on a semiconductor substrate, the nanosheet channel stack comprising one or more layers of a semiconducting material providing nanosheet channels for one or more nanosheet field-effect transistors and an insulator layer as the bottom most layer disposed on the semiconductor substrate;

a first epitaxial oxide spacer layer and a second epitaxial oxide spacer layer disposed on respective outer ends of a bottom surface of the insulator layer and extending downwardly into the semiconductor substrate, wherein the semiconductor substrate is disposed between the first epitaxial oxide spacer layer and the second epitaxial oxide spacer layer;

shallow trench isolation regions disposed adjacent the nanosheet channel stack and extending downwardly from a top surface of the semiconductor substrate, wherein a portion of each of the shallow trench isolation regions is disposed on an outer sidewall of the respective epitaxial oxide spacer layer; and a gate surrounding the nanosheet channel stack and on a top surface of each of the shallow trench isolation regions.

19. The integrated circuit according to claim 18, wherein the semiconductor substrate is silicon and the epitaxial oxide spacer layer comprises a layer of a mixed rare earth oxide, the mixed rare earth oxide being single crystal and lattice-matched to silicon.

20. The integrated circuit according to claim 19, wherein the mixed rare earth oxide comprises a compound having a chemical formula $(A_xB_{1-x})_2O_3$, wherein A represents a first rare earth element and B represents a second rare earth element.

* * * * *